United States Patent [19]

Shin et al.

[11] Patent Number: 5,414,302
[45] Date of Patent: May 9, 1995

[54] SEMICONDUCTOR DEVICE WITH A MULTILAYERED CONTACT STRUCTURE HAVING A BORO-PHOSPHATE SILICATE GLASS PLANARIZING LAYER

[75] Inventors: Yun-seung Shin; Sung-nam Chang, both of Kyunggi, Rep. of Korea

[73] Assignee: Samsung Electronics Co., Ltd., Kyunggi, Rep. of Korea

[21] Appl. No.: 188,113

[22] Filed: Jan. 28, 1994

Related U.S. Application Data

[63] Continuation of Ser. No. 876,097, Apr. 30, 1992, abandoned.

[30] Foreign Application Priority Data

Mar. 4, 1992 [KR] Rep. of Korea .................. 92-3559

[51] Int. Cl.$^6$ ................ H01L 23/48; H01L 29/44; H01L 29/52; H01L 29/10
[52] U.S. Cl. .................... 257/752; 257/755; 257/757; 257/758; 257/763; 257/764; 257/768; 257/770; 257/774; 257/781
[58] Field of Search .............. 257/692, 758, 763, 752, 257/753, 755, 757, 763, 758, 764, 768, 770, 774, 781

[56] References Cited

U.S. PATENT DOCUMENTS

4,739,384 4/1988 Higashi et al. ............ 257/758
4,795,722 1/1989 Welch et al. ............ 257/752

OTHER PUBLICATIONS

Yamanaka, T., et al., "A 5.9 $\mu m^2$ Super Low Power SRAM Cell Using A New Phase-Shift Lithography", *IEDM*, 477–480 (1990).

Kawamoto, Y., et al., "A 1.28 $\mu m^2$ Bit Line Shielded Memory Cell Technology for 64 Mb DRAMs", *Symposium on VLSI Technology*, 13–14 (1990).

*Primary Examiner*—Andrew J. James
*Assistant Examiner*—Carl Whitehead, Jr.
*Attorney, Agent, or Firm*—Rothwell, Figg, Ernst & Kurz

[57] ABSTRACT

A high-density semiconductor memory device has a self-aligning contact structure for electrical connection between lower and upper conductive layers, and an inter-insulating layer with a via for forming the contact structure. The contact structure has a contact pad including a first conductive layer electrically connected with the lower conductive layer within the via and formed on a predetermined portion of the inter-insulating layer around the groove, a planarizing material filling up the groove formed on the first conductive layer, and second conductive layers formed on the planarizing material and exposed first conductive layer.

10 Claims, 3 Drawing Sheets

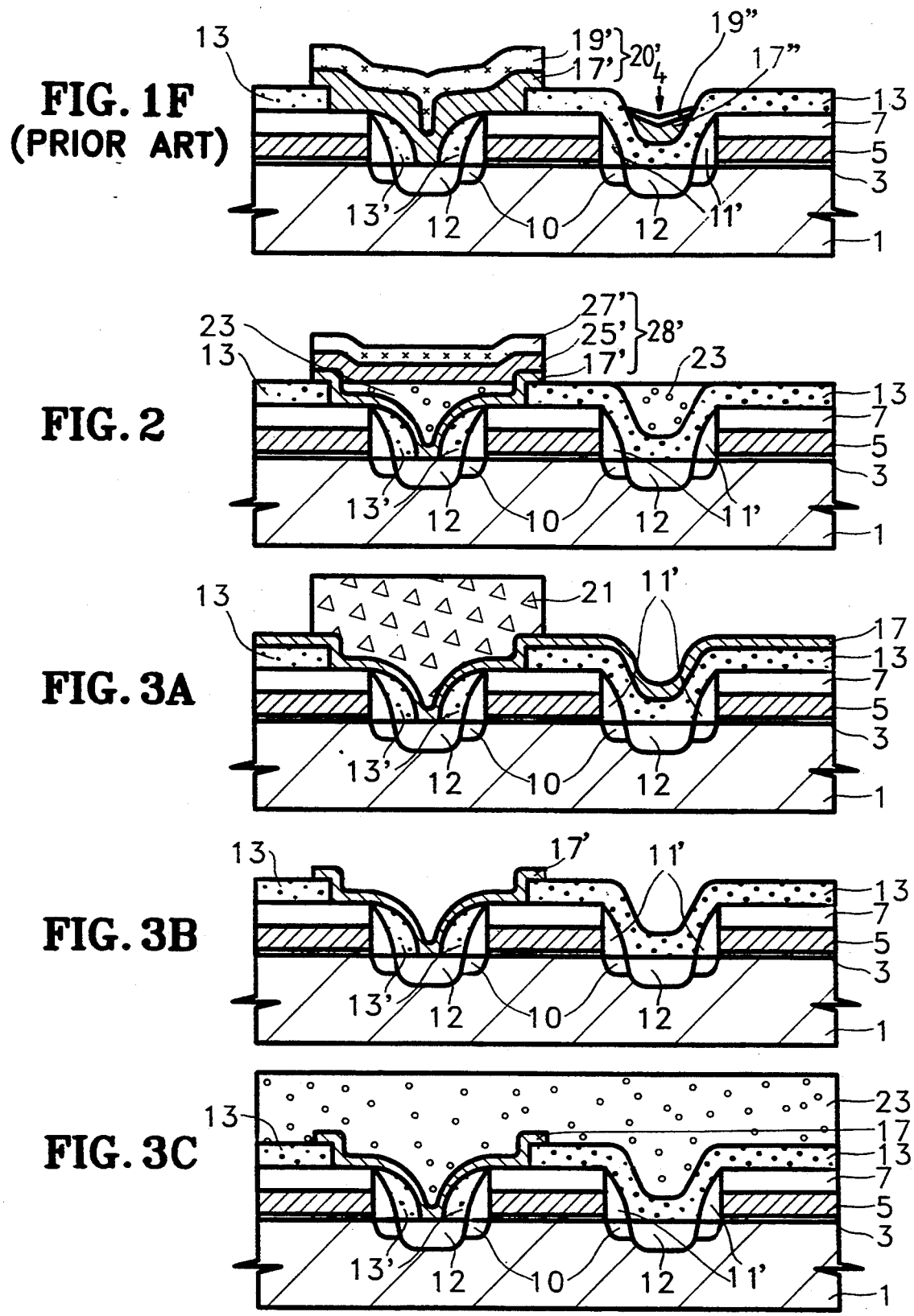

SEMICONDUCTOR DEVICE WITH A MULTILAYERED CONTACT STRUCTURE HAVING A BORO-PHOSPHATE SILICATE GLASS PLANARIZING LAYER

This is a continuation of application Ser. No. 07/876,097, filed Apr. 30, 1992, now abandoned.

BACKGROUND OF THE INVENTION

The present invention relates to a high-density semiconductor device and a manufacturing method thereof, and more particularly to a high density semiconductor device having a self-aligned contact structure, and a method for manufacturing the same.

Recently, along with the trend toward attaining ultra-high density in semiconductor memory devices, the contact area has been decreased for inter-layer contacts or metal interconnections. Accordingly, the aspect ratio (depth-to-diameter) of the contact hole has increased 1.5 times, which in turn increases the defect rate caused by contact failures within the narrow and deep contact holes.

In a 16 Mbit SRAM of Yamanaka presented in IEDM90, pp. 477–480, the nest contact size is 0.4 $\mu m \times 0.4$ $\mu m$. Additionally, in a 64 Mbit DRAM of Kawamoto presented in Symposium on VLSI Technology, 1990, pp. 13–14, a 0.3 $\mu m$ design rule is used and a method for forming a buried bitline contact hole self-aligned in the word line is disclosed. That is, in a high-density semiconductor device using a design rule below one-half micron, a contact hole is opened by a self-aligning method using anisotropic etching instead of the conventional photolithography process. Also, a selective silicon growth method is used to form a contact pad, or a low-resistance bitline is formed using a polysilicon planarization technique.

However, according to the selective silicon growth technique of Yamanaka, after forming a self-aligned contact, silicon is selectively grown and then the planarizing process of the following inter-insulating layer is carried out, making the process overly complicated. Moreover, due to the selective silicon growth, the manufacturing cost is increased and micro-bridging occurs. Furthermore, in the polysilicon planarizing technique of Kawamoto, after a polysilicon layer is thickly formed, its surface is planarized by an etch-back process, a refractory silicide layer such as $WSi_2$ is deposited thereon, and then a bitline pattern is formed by the photolithography process. Therefore, a stringer is generated by the unremoved polysilicon left along the groove of downward stepped portion of the insulating layer.

To specifically describe the problems of the conventional technique, the contact formation process of a conventional SRAM will be described with reference to FIGS. 1A through 1F.

Referring to FIG. 1A, a gate oxide layer 3, a gate electrode layer 5, and a first insulating layer 7 of a high temperature oxide (HTO) are sequentially formed on a semiconductor substrate 1. Then, a photoresist is coated on first insulating layer 7, and a photoresist pattern 9 is formed by a photolithography process, using a gate electrode pattern mask.

Referring to FIG. 1B, first insulating layer 7 and gate electrode layer 5 are selectively etched using photoresist pattern 9 as a mask, thereby forming the gate electrode pattern. Thereafter, a low-density impurity region 10 which is self-aligned with the gate electrode pattern is formed in semiconductor substrate 1, and photoresist pattern 9 is removed. Then, a second insulating layer 11, e.g., an HTO layer, is deposited on semiconductor substrate 1.

Referring to FIG. 1C, second insulating layer 11 is anisotropically etched to form a first gate sidewall spacer 11' only on the sidewalls of the gate electrode pattern, and a high-density impurity region 12 which is self-aligned with first gate sidewall spacer 11' is formed in semiconductor substrate 1. Successively, a third insulating layer 13 of an oxide layer is deposited on semiconductor substrate 1. After that, a photoresist is coated on third insulating layer 13, and an opening 15 is exposed in the photoresist via a photolithography process, using a mask for forming a contact hole pattern.

Referring to FIG. 1D, a contact hole is opened by the anisotropic etching of third insulating layer 13 which is exposed via opening 15. At this time, a second gate sidewall spacer 13' of third insulating layer 13 is formed on first gate sidewall spacer 11'.

Referring to FIG. 1E, after removing the photoresist, first conductive layer 20 composed of polysilicon 17 and refractory metal 19, respectively, are deposited on semiconductor substrate 1. Then, first conductive layer 20 is covered with a photoresist, and photoresist pattern 21 is left only where a contact pad will be formed via photolithography process, using a mask for forming contact pad pattern.

Referring to FIG. 1F, first conductive layer 20 is anisotropically etched using photoresist pattern 21, then contact pad 20' composed of upper pad 17' and lower pad 19' is left only under the photoresist pattern 21. At this time, residual layers 17" and 19" which are the remaining material of the first conductive layers, remain along a groove 4 formed in the downward stepped portion of third insulating layer 13. These residual layers 17" and 19" extend along groove 4 and form stringers, and thus provide an electrical path between metal interconnections formed thereon, causing shorts. This increases the defect rate and degrades the reliability of the device.

Therefore, to remove such residual layers 17" and 19", the first conductive layers are over-etched during anisotropic etching. However, the conductive residue within the groove is difficult to completely eliminate.

SUMMARY OF THE INVENTION

Accordingly, it is the object of the present invention to provide an improved semiconductor device and manufacturing method thereof.

To achieve the above and other objects of the present invention, there is provided a semiconductor device comprising:
- a contact structure for electrical connection between a lower conductive layer and an upper conductive layer; and
- an inter-insulating layer with a via for forming the contact structure,
- wherein the contact structure has a contact pad including:
  - a first conductive layer electrically connected with the lower conductive layer within the via and formed on a predetermined portion of the inter-insulating layer around the via;
  - a planarizing material filling up the via formed on the first conductive layer; and second conductive layers formed on the planarizing material and exposed first conductive layer.

According to one embodiment of the present invention, a gate sidewall spacer is formed around the lower portion of the via, and the inner surface of the upper portion of the via contact the sidewall of the inter-insulating layer.

Preferably, the first conductive layer is formed by thinly depositing a polysilicon layer, and the second conductive layers are formed of a polysilicon or a polycide composed of polysilicon and refractory metal compound. Also, the planarizing material is preferably boro-phosphor silicate glass (BPSG).

In addition, there is provided a method for manufacturing a semiconductor device comprising the steps of:
  forming an inter-insulating layer having a via on a semiconductor substrate for forming a contact structure;
  forming a first conductive layer on the inside of the via and a predetermined portion of the inter-insulating layer around the via; and
  filling up the via with an inter-planarizing material and forming second conductive layers on the planarizing material and the exposed first conductive layer.

According to one embodiment of the present invention, the step of forming the inter-insulating layer with the via for contact structure formation comprises a process for forming the inter-insulating layer on the semiconductor substrate having a MOS transistor thereon, and forming an opening in the inter-insulating layer by a photolithography process.

Preferably, the step of forming the first conductive layer comprises a process for thinly depositing the first conductive layer on the semiconductor substrate having the inter-insulating layer thereon, and patterning the first conductive layer to form a contact pad pattern.

Also, the step of filling up the inter-planarizing material comprises a process for depositing and reflowing the inter-planarizing material on the whole surface of the semiconductor substrate having the first conductive layer thereon, and then carrying out the etch-back process until the upper surface of the first conductive layer is exposed.

The step of forming the second conductive layers comprises a process for depositing the second conductive layers on the exposed first conductive layer and inter-planarizing material, and patterning them through a photolithography process to the contact pad pattern.

Here, the first conductive layer is preferably formed by depositing a thin polysilicon layer, and the second conductive layers are formed by sequentially depositing the polysilicon and refractory metal.

It is also preferable that the inter-planarizing material is BPSG.

BRIEF DESCRIPTION OF THE DRAWINGS

The above objects and other advantages of the present invention will become more apparent by describing in detail the preferred embodiment of the present invention with reference to the attached drawings in which:

FIGS. 1A through 1F are views showing the manufacturing process of a conventional high-density semiconductor device;

FIG. 2 is a sectional view of a high-density semiconductor memory device of the present invention; and FIGS. 3A through 3F are views showing the manufacturing process of the high-density semiconductor device according to the present invention.

DETAILED DESCRIPTION OF THE INVENTION

Figure 1A:
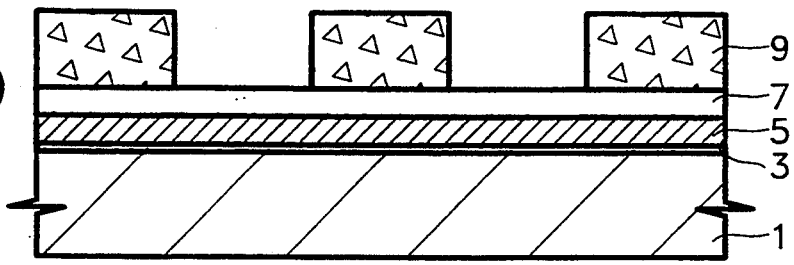
Figure 1B:
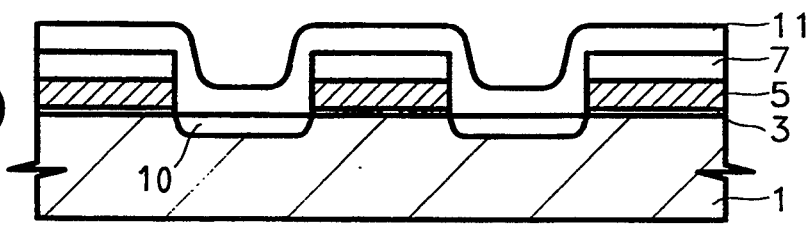
Figure 1C:
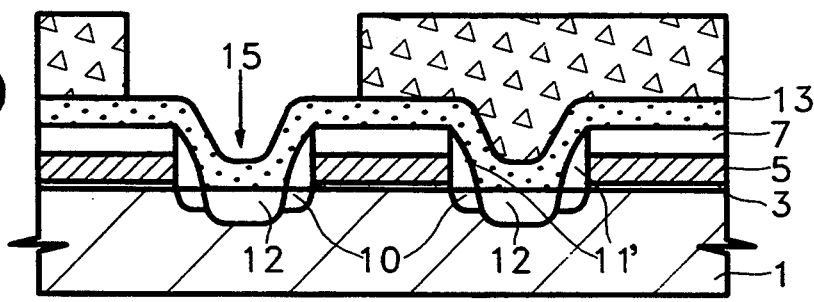
Figure 1D:
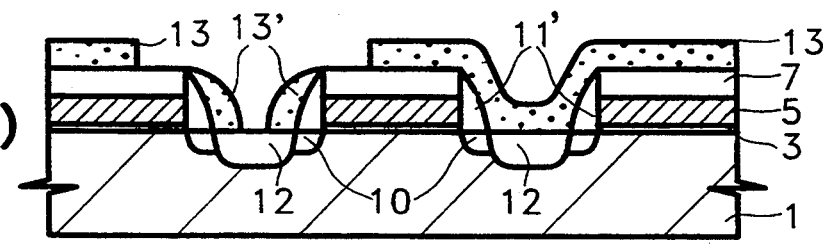
Figure 1E:
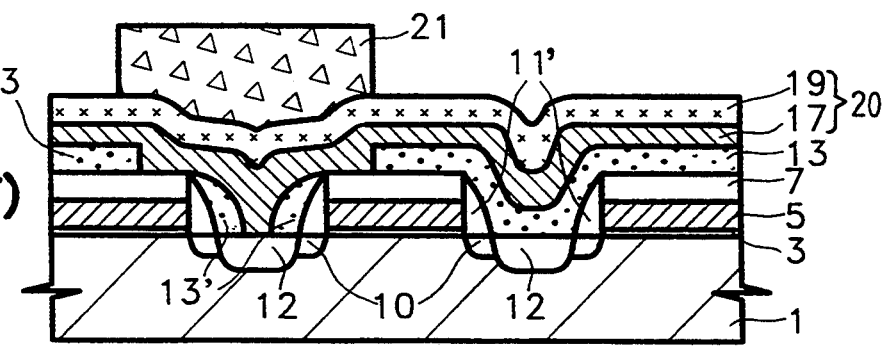

FIG. 2 illustrates a sectional view of a semiconductor device manufactured by the method according to the present invention.

As shown in the drawing, the contact pad structure of the semiconductor device according to the present invention is composed of a contact pad 17' formed of a first conductive layer formed on inter-insulating layers 7, 13, and 13' wherein a via is formed; an inter-planarizing layer 23 formed by filling up the via, i.e., the hollowed portion of the first conductive layer; and another contact pad 28' formed of second conductive layers connected with the upper portion of contact pad 17'.

Accordingly, since the topmost surface of the contact pad is planarized, the electrical connection with the upper conductive layer becomes easy when the contact pad structure of the present invention is adopted to a semiconductor device.

FIGS. 3A through 3F illustrate the sequential manufacturing process of the high-density semiconductor device according to the present invention.

The process for forming a second gate sidewall spacer composed of a third insulating layer on a first gate sidewall spacer is identical to the conventional one shown in FIGS. 1A through 1D, which will be thus omitted.

Referring to FIG. 3A, a polysilicon is thinly deposited on the semiconductor substrate which already has third insulating layer 13 and second gate sidewall spacer 13' deposited thereon, thereby forming first conductive layer 17. Then, a photoresist is coated on first conductive layer 17, and through a photolithography process using a mask for forming a contact pad pattern, a photoresist pattern 21 is left only where the contact pad will be formed.

Referring to FIG. 3B, first conductive layer 17 is anisotropically etched using photoresist pattern 21 to form contact pad 17' remaining only under the photoresist pattern. At this time, since first conductive layer 17 is thin, the first conductive layer on the portions besides the contact pad region are completely removed, stringers are not left within the groove formed in the downward stepped portion of the third insulating layer.

Referring to FIG. 3C, the photoresist pattern is removed, and a fourth insulating layer 23 which is formed of boro-phosphor silicate glass (BPSG) is deposited on the whole surface of the resultant structure. After that, a reflow process is carried out at high temperature, e.g., 850° C.-900° C.

Figure 3D:
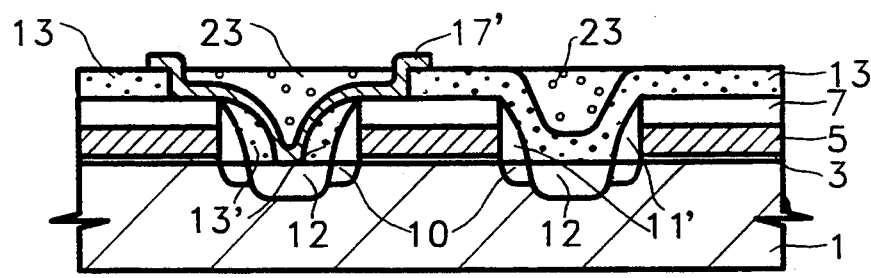

Referring to FIG. 3D, fourth insulating layer 23 is etched-back, and the hollowed groove of contact pad 17' is planarized by fourth insulating layer 23, and at the same time, a protruding portion of contact pad 17', i.e., the upper ends thereof, is exposed.

Figure 3E:
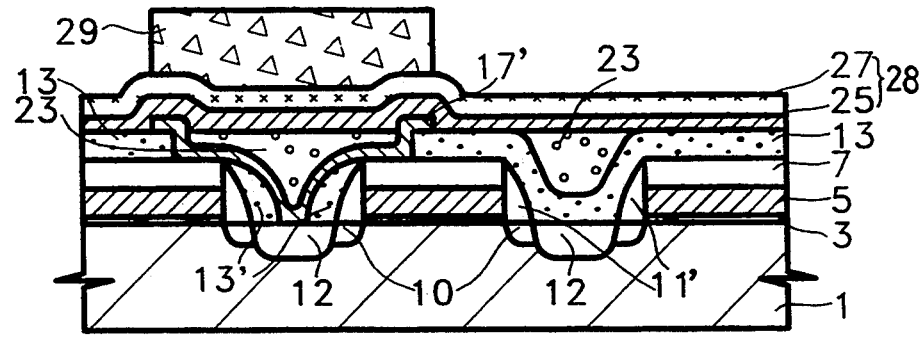

Referring to FIG. 3E, second conductive layer 28 consisting of a polysilicon 25 and a refractory metal compound 27 such as $WSi_2$, are deposited on the whole surface of the obtained structure. Then, a photoresist is coated thereon, and a photoresist pattern 29 is left only where the contact pad will be formed, through a photolithography process using the same contact pad pattern mask used for forming photoresist pattern 21.

Figure 3F:
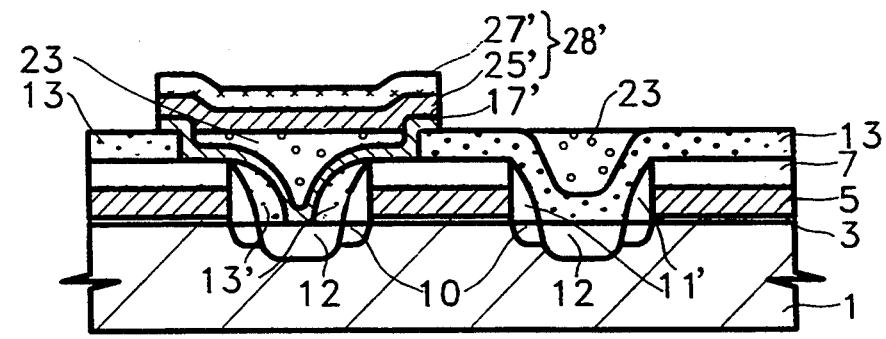

Referring to FIG. 3F, when second conductive layer 28 is anisotropically etched using the photoresist pattern 29, thereby forming another contact pad 28' consisting of upper pad 27' and lower pad 25', the exposed protruding portion of contact pad 17' becomes connected with the other contact pad 28'.

According to the present invention as described above, since the top surface of the contact pad is planarized, the electrical connection to the upper conductive layers becomes easy. Further, after opening the self-aligned contact, the first conductive layer is thinly deposited to form the contact pad, and then is patterned and etched, the hollowed groove portion of the first conductive layer is planarized with the insulating layer composed of a BPSG, and the second conductive layers are formed to be connected to the first conductive layer, so that the residue (stringer) is not left in the hollowed groove. Therefore, the reliability is improved when the method of the present invention is adopted to manufacture a high-density semiconductor device.

What is claimed is:

1. A semiconductor device having a contact pad structure located in a via of an inter-insulating layer for effectuating an electrical connection, said contact pad structure comprises:
    a first conductive layer which is formed within said via and has an upper end portion formed on a predetermined portion of said inter-insulating layer around the via;
    a planarizing material filling up the via, which is formed on said first conductive layer, said planarizing material being an insulating material; and
    a second conductive layer formed on said planarizing material and electrically connected with said first conductive layer through said upper end portion.

2. A semiconductor device as claimed in claim 1, wherein a gate sidewall spacer is formed around the lower portion of said groove, and the inner surface of the upper portion of said groove is the sidewall of said inter-insulating layer.

3. A semiconductor device as claimed in claim 1, wherein said first conductive layer is formed by thinly depositing a polysilicon.

4. A semiconductor device as claimed in claim 1, wherein said planarizing material is boro-phosphor silicate glass (BPSG).

5. A semiconductor device as claimed in claim 1, wherein said second conductive layer is formed of a polysilicon.

6. A semiconductor device as claimed in claim 1, wherein said second conductive layers are formed of a polysilicon and a refractory metal compound.

7. A semiconductor device as claimed in claim 6, wherein said refractory metal compound is $WSi_2$.

8. A semiconductor device as claimed in claim 1, wherein said contact pad structure is a self-aligned pad structure.

9. A semiconductor device as claimed in claim 1, wherein said device is a SRAM (Static Random Access Memory).

10. The semiconductor device as set forth in claim 1, wherein said second conducting layer formed on said planarizing material is electrically connected with said first conductive layer only through said upper end portion.

* * * * *

UNITED STATES PATENT AND TRADEMARK OFFICE
CERTIFICATE OF CORRECTION

PATENT NO. : 5,414,302
DATED : May 9, 1995
INVENTOR(S) : Yun-seung Shin et al.

It is certified that error appears in the above-indentified patent and that said Letters Patent is hereby corrected as shown below:

In the Abstract, line 9, "groove" should be --via--.

Signed and Sealed this

Seventeenth Day of October, 1995

Attest:

BRUCE LEHMAN

*Attesting Officer*     *Commissioner of Patents and Trademarks*